United States Patent
Conte et al.

(10) Patent No.: US 6,704,233 B2
(45) Date of Patent: Mar. 9, 2004

(54) SENSING CIRCUITRY FOR READING AND VERIFYING THE CONTENTS OF ELECTRICALLY PROGRAMMABLE AND ERASABLE NON-VOLATILE MEMORY CELLS, USEFUL IN LOW SUPPLY-VOLTAGE TECHNOLOGIES

(75) Inventors: Antonino Conte, Tremestrieri Etneo (IT); Gianbattista Lo Giudice, Palermo (IT); Alfredo Signorello, Belpasso (IT)

(73) Assignee: STMicroelectronics, S.r.l., Agrate Brianza (IT)

( * ) Notice: Subject to any disclaimer, the term of this patent is extended or adjusted under 35 U.S.C. 154(b) by 0 days.

(21) Appl. No.: 10/171,508

(22) Filed: Jun. 12, 2002

(65) Prior Publication Data

US 2002/0190297 A1 Dec. 19, 2002

(30) Foreign Application Priority Data

Jun. 12, 2001 (IT) .................... MI200101231

(51) Int. Cl.[7] .............................. G11C 7/00
(52) U.S. Cl. ............ 365/205; 365/185.22; 365/185.21; 365/185.2; 365/207; 365/189.09; 365/189.07
(58) Field of Search .................... 365/185.01, 185.2, 365/185.22, 185.21, 207, 189.01, 189.09, 189.07

(56) References Cited

U.S. PATENT DOCUMENTS

| | | | | |
|---|---|---|---|---|
| 6,097,635 A | * | 8/2000 | Chang | 365/185.21 |
| 6,292,398 B1 | * | 9/2001 | Pasotti et al. | 365/185.21 |
| 6,351,416 B2 | * | 2/2002 | Fuchigami et al. | 365/185.21 |
| 6,442,091 B2 | * | 8/2002 | Verbeck | 365/208 |
| 6,515,909 B1 | * | 2/2003 | Wooldridge | 365/185.22 |
| 2001/0024381 A1 | * | 9/2001 | Fuchigami et al. | 365/185.21 |
| 2001/0038564 A1 | * | 11/2001 | Verbeck | 365/208 |
| 2002/0057597 A1 | * | 5/2002 | Fuchigami et al. | 365/185.21 |
| 2002/0071313 A1 | * | 6/2002 | Takano et al. | 365/185.22 |
| 2003/0035324 A1 | * | 2/2003 | Fujita et al. | 365/189.07 |

FOREIGN PATENT DOCUMENTS

| JP | 02002184190 | * | 6/2002 | G11C/16/02 |
|---|---|---|---|---|

* cited by examiner

*Primary Examiner*—Viet Q. Nguyen
(74) *Attorney, Agent, or Firm*—Lisa K. Jorgenson; Bryan A. Santarelli; Graybeal Jackson Haley LLP

(57) ABSTRACT

Sensing circuitry for reading and verifying the contents of electrically programmable and erasable non-volatile memory cells including a sense amplifier having a first sensing circuit portion connected to a cell to be read and provided with an output terminal for connection to a first input terminal of a comparator, and having a second reference circuit portion connected to a reference current generator and provided with an output terminal for connection to a second input terminal of said comparator, characterized in that said first and said second circuit portions comprise a series of first and second transistors, respectively, being connected between a first voltage reference and a second voltage reference and having respective points of interconnection connected to said output terminals of said first and second circuit portions.

15 Claims, 5 Drawing Sheets

SENSING CIRCUITRY FOR READING AND VERIFYING THE CONTENTS OF ELECTRICALLY PROGRAMMABLE AND ERASABLE NON-VOLATILE MEMORY CELLS, USEFUL IN LOW SUPPLY-VOLTAGE TECHNOLOGIES

BACKGROUND

1. Technical Field

The present invention relates to sensing circuitry for reading and verifying the contents of electrically programmable and erasable non-volatile memory cells, useful in low-supply-voltage technologies.

Specifically, the invention relates to sensing circuitry for reading and verifying the contents of electrically programmable and erasable non-volatile memory cells, said sensing circuitry comprising a sense amplifier having a first sensing-circuit portion connected to a cell to be read and a second reference-load-circuit portion connected to a reference generator.

The invention relates, particularly but not exclusively, to circuitry for sensing the state of memory cells in embedded applications with low supply voltages, this description making reference to that field of application for convenience of illustration only.

2. Prior Art

As is well known, semiconductor memories are organized in cell arrays set up as rows or wordlines and columns or bitlines.

Each cell has essentially a floating-gate transistor, which also has drain and source terminals. The floating gate is formed on top of a semiconductor substrate and separated from the substrate by a thin layer of gate oxide. A control gate is coupled capacitively to the floating gate through a dielectric layer, and metal electrodes are provided to contact the drain, source, and control gate so that predetermined voltage values can be applied the memory cell.

The cells in one wordline share an electric line driving their respective control gates (directly in flash memories, and indirectly through a pass transistor in EEPROMs), while the cells in one bitline have the drain terminal in common.

The state of the cell is sensed, i.e. the information stored in it is "read", by means of sensing circuitry.

The reading is effected by sensing a current value that flows through a cell to be read, at a preset bias through an amplifying circuit, in particular a sense amplifier.

The sense amplifier is used to bias the cell drain terminal, as well as to read the cell state. The drain terminal is accessed through the bitline, which is, as mentioned before, a metal line interconnecting (directly in flash memories, and indirectly through a select transistor in EEPROMs) the drain terminals of all the cells in one column of the array. Thus, the bitline has an amount of capacitance that is proportionate to the vertical dimension of the array and must be precharged at the voltage level to which the drain terminal of a cell being read is to be biased. The precharging is also performed through the sense amplifier.

Recent generations of memories are designed to provide shorter access times along with larger storage capacities (i.e., number of cells) with supply voltages that are specified at ever lower levels.

Accordingly, faster sense amplifiers at low supply voltages are in demand.

A first prior approach to satisfy this demand is illustrated by a conventional sense amplifier SA1 for use in smart card applications, as shown in FIG. 1.

In particular, the sense amplifier SA1 has a first circuit portion or sensing portion 1 connected between a voltage supply Vdd and ground GND.

The sensing portion 1 has a first leg, comprising a cascade of a PMOS transistor Mmir10 and an NMOS transistor M10. The sensing portion 1 also has a second leg 3 comprising a native transistor NAT1, which is a low-threshold transistor connected between the voltage supply Vdd and a first node A.

The control terminal of the native transistor NAT1 is connected to an interconnection node MAT, itself connecting the transistors Mmir10 and M10 together. The control terminal of transistor M10 is connected to the node A. A resistor R is connected between the node A and a node BUS1.

This node BUS1 is connected, through a decode circuit N1, to the drain terminal of a cell 4 whose state is to be sensed.

At steady state, the current flowing through the cell 4 also flows through the transistor NAT1. Since the voltage level at node A is dependent on the size of transistor M10 and the bias current to transistor NAT1, the node MAT is brought to a level such that a voltage VGS (VMAT-VA) at transistor NAT1 will cause a current I flowing through the transistor M10 to equal the current ICELL1 flowing through the cell 4. Therefore, transistor NAT1 effects a current-to-voltage conversion.

The sense amplifier SA1 further comprises a second circuit portion, or reference portion 5, connected between the voltage supply and ground GND. The reference portion 5 has a first leg 7 comprising a cascade of a PMOS transistor Mmir20 and an NMOS transistor M2. The reference portion 5 also has a second leg 6 comprising a native transistor NAT2 connected between the voltage supply Vdd and a node B.

The control terminal of the native transistor NAT2 is connected to a node REF2, itself connecting the transistors Mmir20 and M2 together. The control terminal of transistor M2 is connected to the node B, which also has a reference cell 8 connected to it.

This reference portion 5 performs dynamically like the first sensing portion 1. The transistor NAT2 effects then a current-to-voltage conversion, with the voltage level at node REF2 being set by a given reference current IREF2.

If more current flows through the cell 4 to be read than through the reference cell 8, then node MAT is at a higher voltage level than node REF2, whereas if the current through the cell 4 to be read is smaller than the current through the reference cell 8, then node MAT is brought at steady state down to a lower voltage level than node REF2.

By comparing these two nodes, MAT and REF2, in a voltage comparator (not shown because conventional) the state of the cell 4 can be determined, the state of the reference cell 8 being known beforehand.

While being advantageous in several aspects, this first approach has shortcomings. The voltage difference between the voltage supply Vdd and ground GND is equal to the sum of the voltage Vds at PMOS Mmir10, voltage Vgs at the native (low-threshold) transistor NAT1, and voltage Vgs at the inverter M10, namely:

$$Vdd = VdsMmir10 + VgsNAT1 + VgsM10 \qquad (1)$$

Equation (1) above becomes a fairly critical one with low supply voltages.

Another shortcoming comes from the bound placed on the size of transistors M10 and NAT1. Transistor M10, in fact, cannot be highly conductive because the bitline bias is dependent on its voltage Vgs.

As best seen with reference to FIG. 2, however, the I–V characteristics of MOS transistors diverge from each other as temperature varies, except around a specific value of the voltage Vgs. This value of Vgs is the value at which temperature compensation is achieved between the effects of diminishing threshold as temperature increases (that depresses Vgs) and diminishing current gain (that increases the voltage Vgs for a given bias current I).

Nor can transistor M10 deviate substantially from that value of the voltage Vgs. For example, it may be about 740 mV, to prevent the bitline bias from changing substantially with temperature.

Transistor NAT1 cannot be highly conductive because the sensitivity S of the sense amplifier is dependent on it, as follows:

$$S=|dVMAT/dICELL1|=1/gmNAT1 \quad (2)$$

where,

VMAT is the voltage at node MAT;

ICELL1 is the current through the cell 4 to be read; and gmBAT1 is the transconductance of the native transistor NAT1.

For instance, assuming the circuit of FIG. 1 to have been dimensioned for sensitivity S≧25 mV/uA and the voltage difference at node BUS1 (ΔVbus1)≦60 mV at varying temperatures between −40° and 125° C., a current ICELL1=3 uA is sufficient to bring the node MAT to about 1.1V, as shown in FIG. 3, and at Vdd=1.2V, the PMOS transistor Mmir10 has Vds=100 mV and its mirrored current I goes to 7.3 uA, from 8 uA, as shown in FIG. 4.

The sensing circuit SA1 is also used to precharge the bitline. Nodes MAT and REF are preset at the supply voltage Vdd and the ground voltage GND, respectively. At power-on of the sensing circuit SA1, node BUS1 is discharged, i.e. is same as GND, and the voltage Vgs at the native transistor NAT1 is initially same as Vdd. At this stage, transistor NAT1 allows the bitline to be precharged with much overdrive and, therefore, a large current ICELL1. BUS1, while under charge, will tend toward the bias voltage set by transistor M10 functioning as an inverter, and by its bias current I. Node MAT is then brought to a sufficient level for the current needed by the cell 4 to be read to flow through transistor NAT1.

Therefore, a need has arisen for a sensing circuit that can be operated on low supply voltages and that overcomes problems that besets prior-art sensing circuits.

SUMMARY OF THE INVENTION

In one aspect of the invention, sensing circuitry includes two current/voltage conversion blocks respectively connected to a memory cell to be read and to a reference cell, said blocks being connected to a single bias and precharge block such that the bias block is not in the conductive path between the voltage supply Vdd and ground GND of the individual conversion blocks.

Features and advantages of the sensing circuit according to the invention will be apparent from the following description of an embodiment thereof, given by way of non-limitative example with reference to the accompanying drawings.

DETAILED DESCRIPTION

Figure 1:
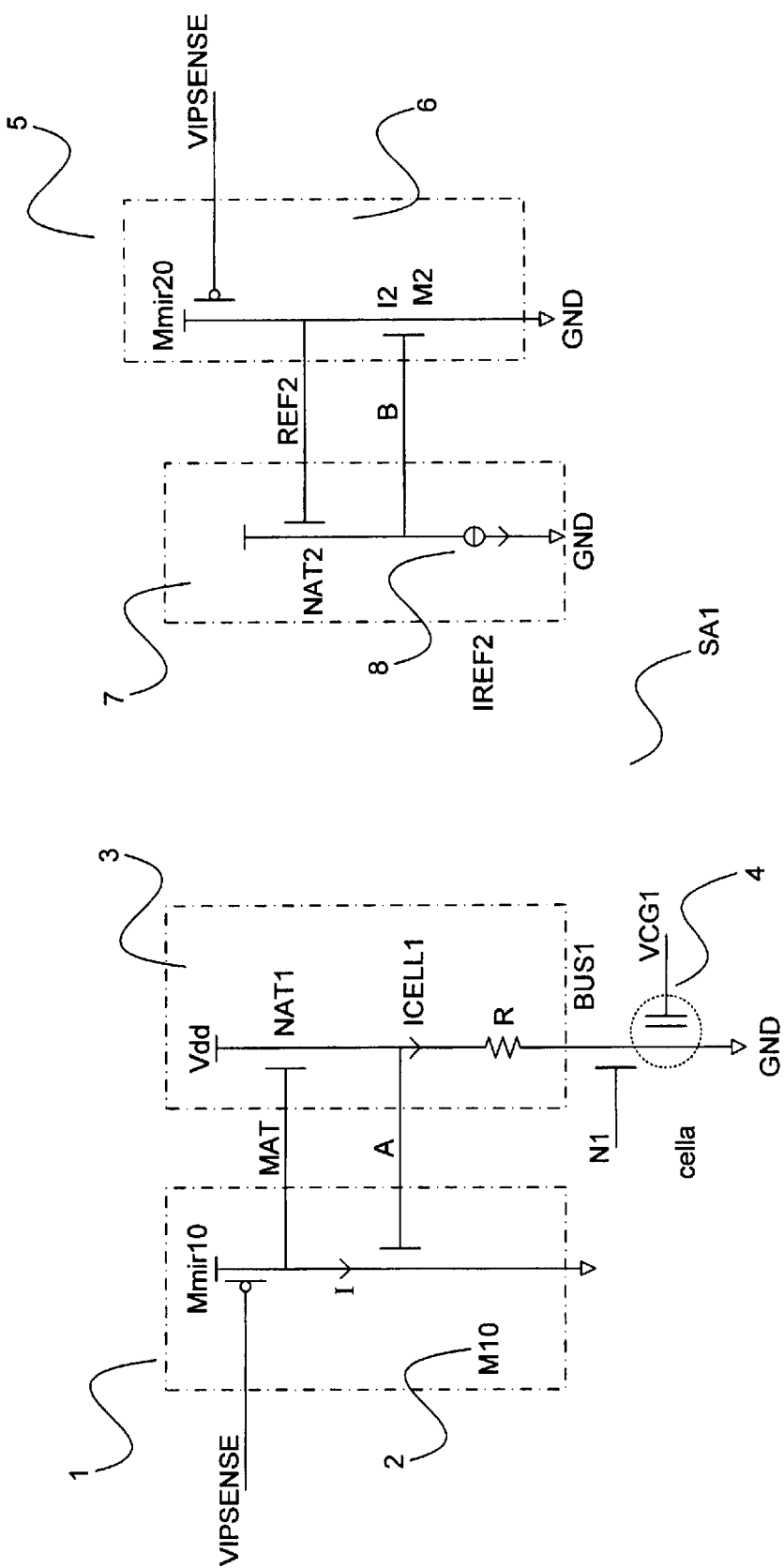
FIG. 1 is a diagram of a sense-amplifier read circuit according to the prior art.
Figure 3:
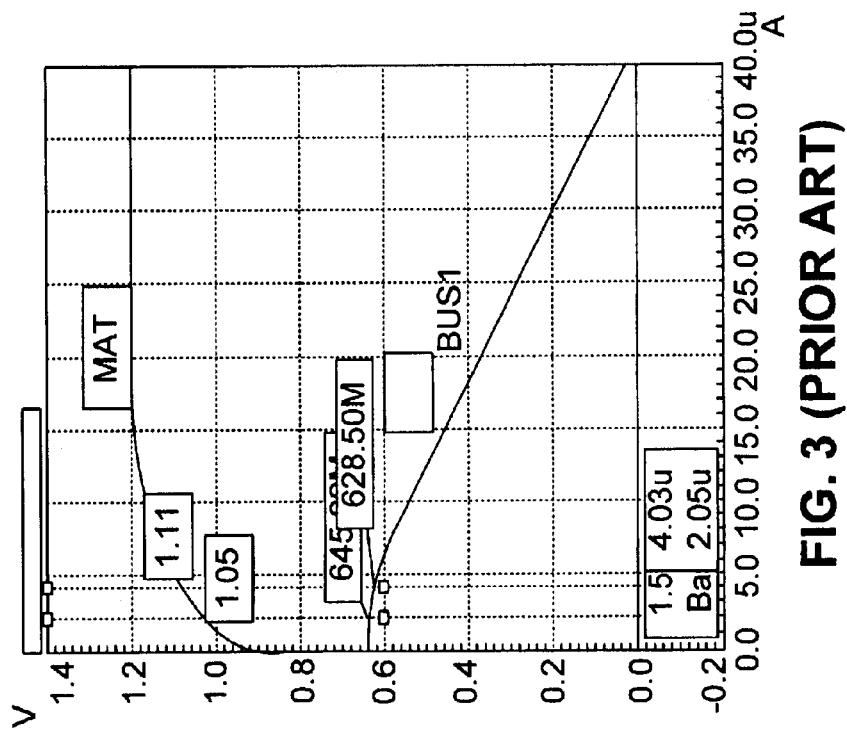
FIG. 3 is a plot of the voltages at two nodes of the sense-amplifier read circuit of FIG. 1.
Figure 2:
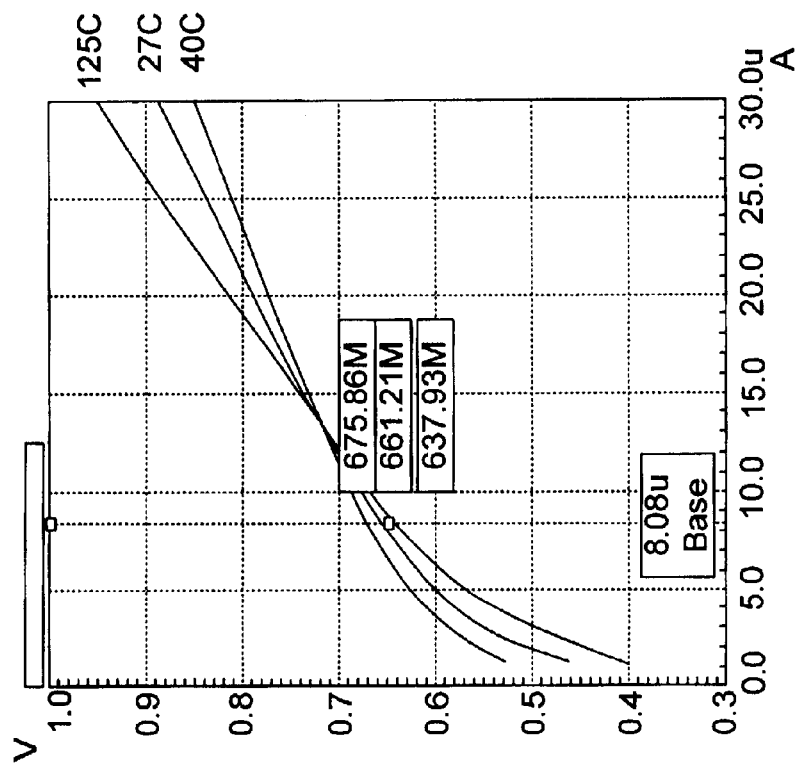
FIG. 2 is a plot of the current vs. voltage characteristics of MOS transistors at different temperatures.
Figure 4:
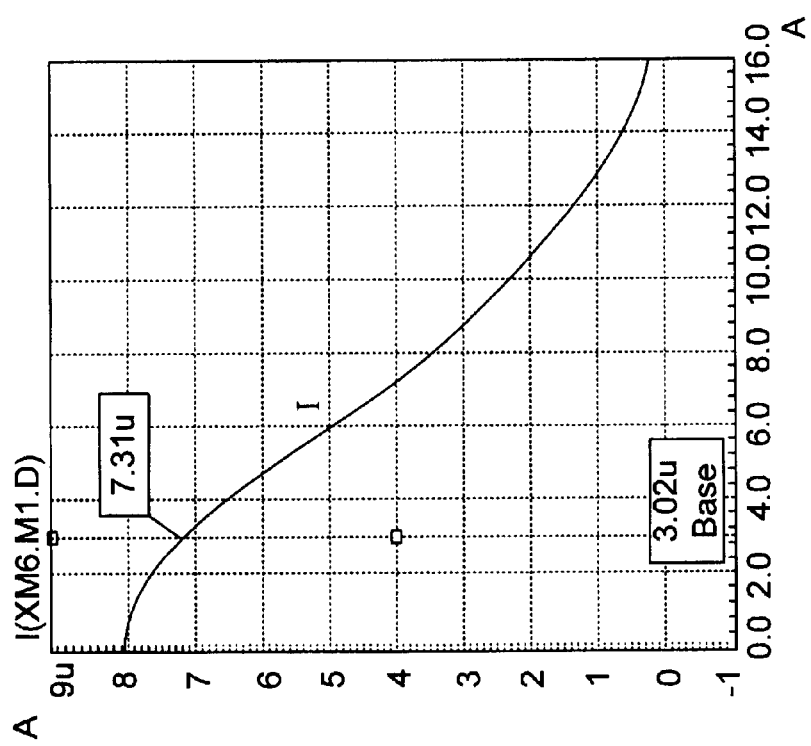
FIG. 4 is a plot of a bias current of the sense-amplifier read circuit of FIG. 1.
Figure 5:
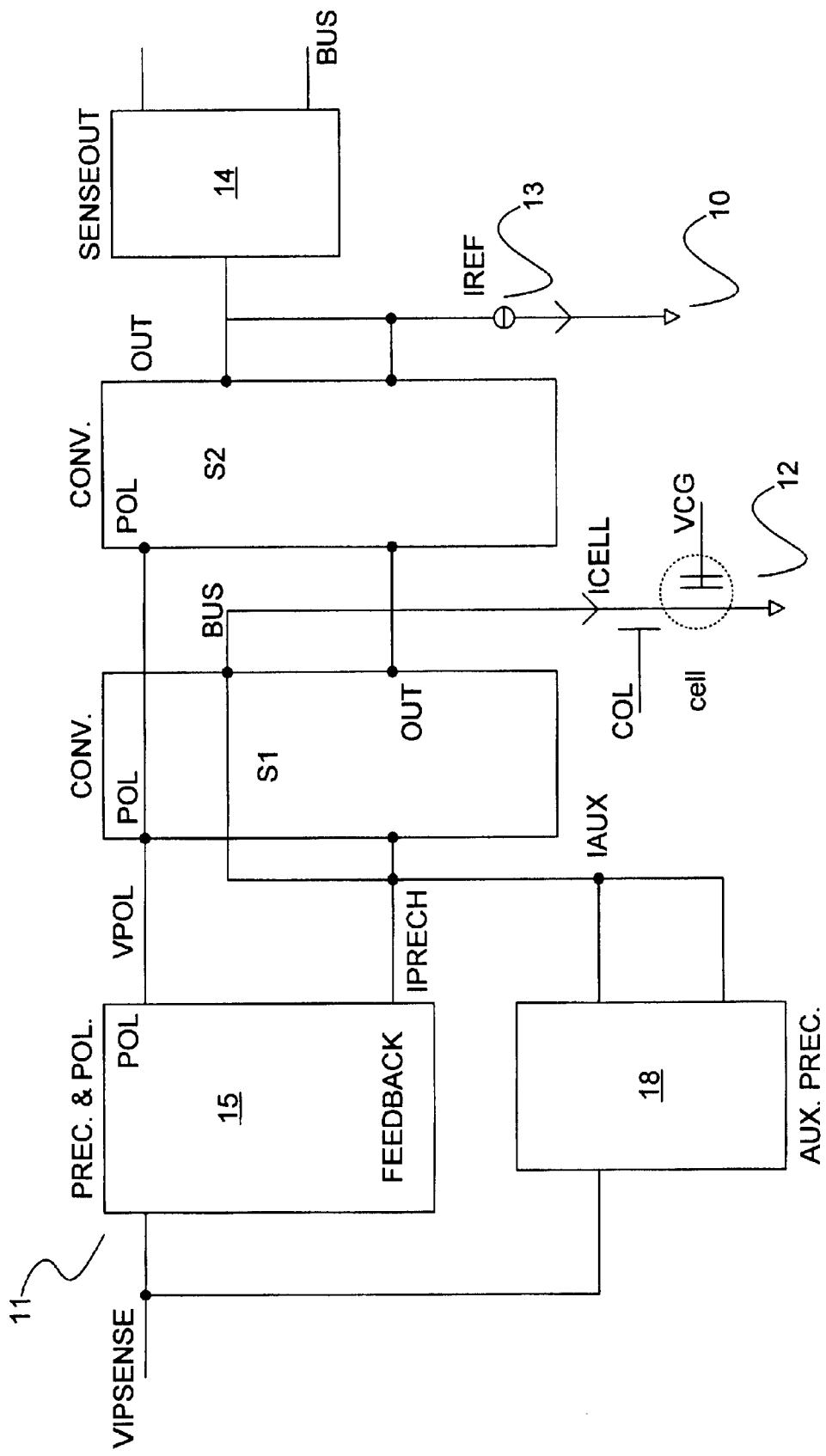
FIG. 5 is a block diagram of sensing circuitry according to an embodiment of the invention.

With reference to the drawings, in particular to FIG. 5 thereof, sensing circuitry for reading and verifying the contents of electrically programmable and erasable non-volatile memory cells, adapted for use in low supply voltage technologies, is shown generally at 10 according to an embodiment of the invention.

The sensing circuitry 10 comprises a sense amplifier 11 of the differential type, employed to compare a current ICELL that flows through a cell 12 in a memory array with a reference current generated by a reference generator IREF. The reference current from the reference generator IREF is the current that flows through a reference cell 13, e.g. a virgin cell, or is generated by a dedicated current-generating circuit.

The sense amplifier 11 uses two current-to-voltage (I/V) conversion blocks S1 and S2 to convert read analog data, i.e. the current values being read, to digital data.

More particularly, the circuitry 10 comprises first and second I/V conversion blocks S1 and S2 that are connected between a first voltage reference, e.g. the voltage supply Vdd, and a second voltage reference, e.g. ground GND. The blocks, S1 and S2, generate first and second voltages VBUS and VOUT1 for comparison in a comparator 14.

According to an embodiment of the invention, a single bias and precharge block 15 supplies a bias current IPOL and a precharge current IPRECH to both blocks S1 and S2.

An embodiment of the sensing circuitry 10 according to the invention will now be described in greater detail with reference to FIG. 6.

Block S1 comprises a first transistor Mmir2, which has its conduction terminals connected between the voltage supply Vdd and a first node BUS. A second transistor M1 has its conduction terminals connected between this node BUS and ground GND.

In a preferred embodiment, the second transistor M1 comprises two transistors M1a and M1b connected in parallel in a diode configuration. The cell 12 to be read is also connected to the node BUS.

The second block S2 comprises a first transistor Mmir3 having its conduction terminals connected between the voltage supply Vdd and a first node OUT. A second transistor M2, which may be an NMOS transistor, has its conduction terminals connected between the node OUT and ground GND.

In a preferred embodiment, the second transistor M2 in the block S2 may advantageously comprise two transistors M2a and M2b connected in parallel, with transistor M2a provided in a diode configuration. The control terminal of transistor M2b is then connected to node BUS.

The control terminals of transistor Mmir2 and transistor Mmir3 are connected together and to the bias and precharge block 15.

Advantageously, these transistors Mmir2 and Mmir3 are PMOS transistors, whereas transistors M1 and M2 are NMOS transistors.

It should be noted that the blocks S1 and S2 of this invention use no bias transistor comparable to the transistors NAT1 and NAT2 of prior circuits. In this way, their path GATE-SOURCE, and hence the voltage VGS, can be removed from the path between the voltage supply Vdd and ground GND.

The bias and precharge block 15 includes a circuit that delivers the reference voltage VPOL to the P-channel transistors Mmir2 and Mmir3, in order to they deliver the precharge current to node BUS.

In particular, the bias and precharge block 15 is connected between the voltage supply Vdd and ground GND, and has a first leg 16, which comprises a cascade of a transistor Mmir1 in diode configuration and a transistor M6. Transistor Mmir1 forms a current mirror configuration with the transistors Mmir2 and Mmir3 of blocks S1 and S2.

The bias and precharge block 15 has, moreover, a second leg 17, which comprises a cascade of a transistor Mmir0 and transistors M4 and M5. The control terminals of transistors M4 and M5 are connected together. The control terminal of transistor Mmir0 is driven by a reference voltage VIPSENSE.

Transistor M6 has its control terminal connected via a common node A to transistors Mmir0 and M5.

Advantageously, transistors Mmir0 and Mmir1 also form a current mirror.

The bias and precharge block 15 further comprises a transistor M3 connected between the shared node by transistors M4, M5 and ground GND. The control terminal of transistor M3 is then connected, via a node FEEDBACK, to the control terminal of the transistor M1 in the first block S1.

Advantageously, transistors Mmir0 and Mmir1 are PMOS transistors, whereas transistors M3, M4, M5 and M6 are NMOS transistors.

Advantageously in this embodiment of the invention, the two blocks S1 and S2 are such that nodes BUS and OUT will be at the same voltage level when the currents ICELL and IREF, respectively, that flows through the cell 12 to be read and the reference cell 13, are the same.

Since at steady state, transistor M3 shorts out the voltage Vds of transistor M4, transistors Mmir1 and Mmir2 will be mirroring a current IPOL, given as:

$$IPOL = I^*(W/L)_{M6}/(W/L)_{M5} \quad (3)$$

where,

I is the current input to node A;

$(W/L)_{M6}$ is the channel aspect ratio e of transistor M6; and $(W/L)_{M5}$ is the channel aspect ratio e of transistor M5.

A current IM1 flowing through transistor M1, comprised of transistors M1a and M1b in parallel, for example, is:

$$IM1 = IPOL - ICELL \quad (4)$$

where,

IPOL is the bias current of blocks S1 and S2; and

ICELL is the current flowing through the cell 12 to be read.

The voltage VBUS at node BUS is proportional, except for the threshold voltage of transistor M1, to the current IM1. Thus, the larger current ICELL, the lower will be the voltage level VBUS at node BUS, according to Relation (4) above, and the higher the voltage level VOUT at node OUT.

By having the voltages at nodes BUS and OUT compared in the voltage comparator 14, the state of the cell 12 to be read can be determined.

Figure 6:
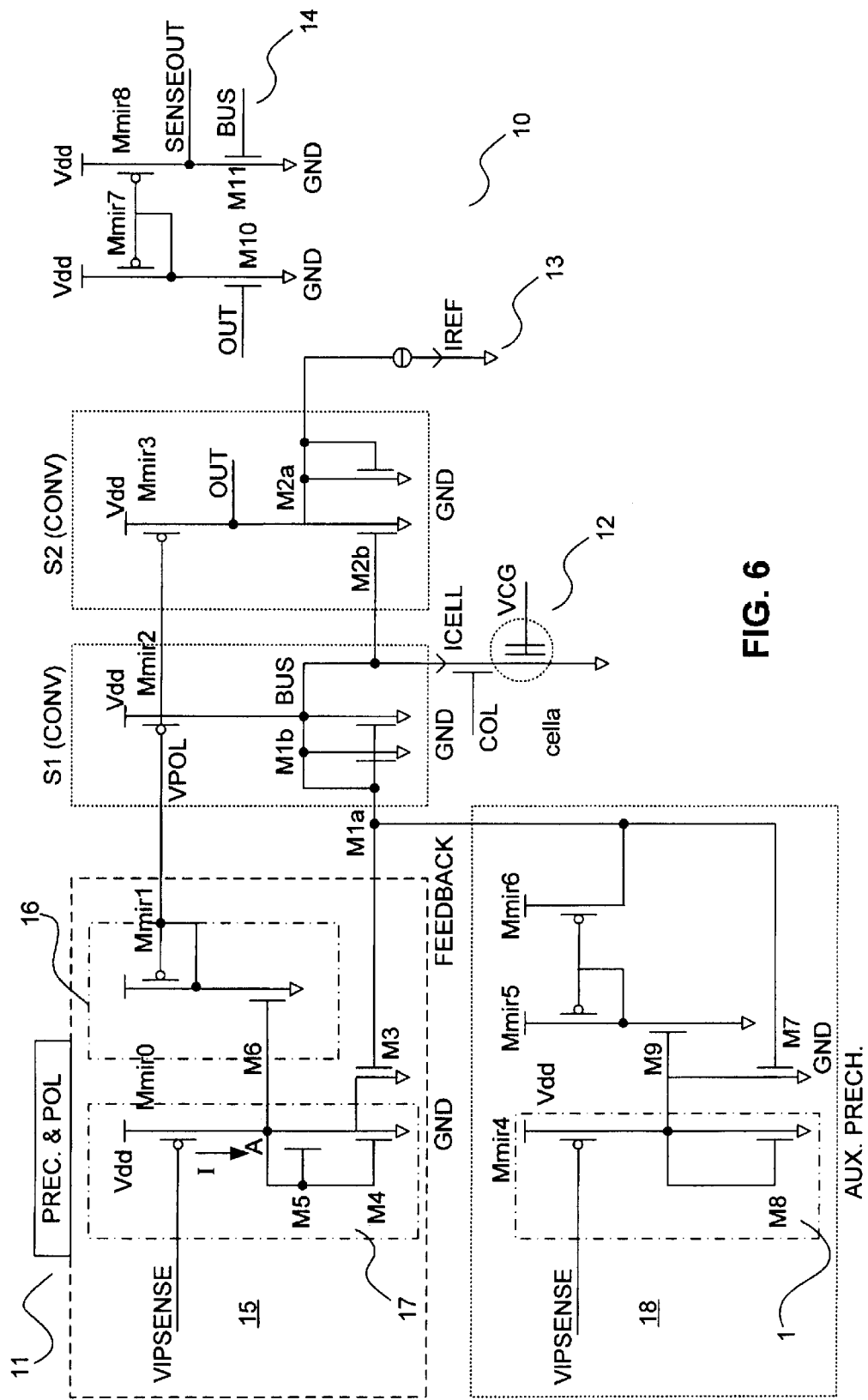
FIG. 6 is a schematic diagram of the sensing circuitry of FIG. 5.

Advantageously, the comparator 14, shown in FIG. 6, used for the comparison does not degrade the performance of the low-voltage sensing circuit 10, since comparator 14 is a similar construction to the I/V conversion blocks S1 and S2.

In particular, the comparator 14 is connected between the voltage supply Vdd and ground GND, and comprises: a current mirror formed of transistors Mmir7 and Mmir8, with transistor Mmir7 in a diode configuration. Each one of the transistors Mmir7 and Mmir8 in the mirror has a transistor M10 and M11 respectively connected in series therewith.

The control terminal of transistor M10 is then connected to node OUT, while the control terminal of transistor M11 is connected to node BUS.

Advantageously, transistors Mmir7 and Mmir8 are PMOS transistors, and transistors M10 and M11 are NMOS transistors.

To have a minimum of sensing errors caused by comparator 14, a good match of blocks S1 and S2 must be achieved. This is done by having the transistors M10, M11, M1 and M2 all of the same size.

This also provides good control of power usage, because the current forced on blocks S1 and S2 of the sense amplifier 11 is at most passed through the transistors Mmir7 and Mmir8 of comparator 14.

How the signals evolve dynamically will now be described.

Nodes BUS and OUT are preset at the supply voltage Vdd and the ground voltage GND, respectively. At power-on of the sense amplifier 11, these nodes BUS and OUT are released, transistor M3 is turned off, and the mirrored current by transistor Mmir1 becomes:

$$IPRECH + IPOL = I(W/L)_{M6}(1/(W/L))_{M4} + 1/(W/L)_{M5}) \quad (5)$$

with, $$IPRECH = I(W/L)_{M6}/(W/L)_{M4} \quad (6)$$

where,

I is the input current to node A;

$(W/L)_{M6}$ is the channel aspect ratio of transistor M6;

$(W/L)_{M4}$ is the channel aspect ratio of transistor M4; and

IPOL is as given by Relation (3).

The capacitance associated with the bitline that is connected to the drain of the cell 12 to be read is precharged quite rapidly by means of the current IPRECH added.

Upon the bitline reaching a level at which transistor M3 is turned on, transistor M3 shorts out transistor M4, and the mirrored current in transistor Mmir1 is again IPOL, according to Relation (3) above.

The more resistive the transistor M4, the larger the current IPRECH and the faster is the bitline charged.

On the other hand, if transistor M4 is made too resistive, the voltage level at node A could reach a value such that transistor Mmir0 will move into the linear range and no longer mirror the input current I to node A correctly.

Advantageously in a modification of the sensing circuitry 10 according to an embodiment of the invention, the sense amplifier 11 further comprises an auxiliary precharge block 18.

The auxiliary precharge block 18 delivers a precharge boost current IAUX.

In particular, the auxiliary precharging circuit 18 is connected between the voltage supply Vdd and ground GND, and comprises a current mirror formed of the PMOS transistors Mmir5 and Mmir6, of which transistor Mmir5 is a diode configuration, and a transistor M9 connected in series with transistor Mmir5.

The auxiliary precharging circuit 18 has also a leg comprising a transistor Mmir4 in cascade with a diode-configured transistor M8. The auxiliary precharging circuit 18 additionally comprises a transistor M7 connected in parallel with transistor M8.

The control terminal of transistor M7 and the conduction terminal of transistor Mmir6 are connected to each other and to node FEEDBACK.

Advantageously, transistors Mmir4, Mmir5 and Mmir6 are PMOS transistors, and transistors M7, M8 and M9 are NMOS transistors.

The auxiliary precharging circuit 18 is dimensioned, for example, to deliver a current only during the precharging step. The more conductive transistor M7, the sooner is the auxiliary precharging step completed. The precharge current IAUX is set in particular by the ratios of the current mirrors formed of the PMOS transistors Mmir5 and Mmir6.

Note should be taken of that this auxiliary precharging step is completed ahead of the sensing step, to avoid overshooting at the node BUS.

The sensing circuitry 10 is suitable to form, for example, a sense amplifier 11 capable of discriminating between the states of cells in an embedded EEPROM macrocell for applications SMARTCARD with a bitline capacitance of about 1 pF, supply voltages of down to 1.2 V or less, and a sensing time of less than 20 ns. Within this time range, the bitline would be precharged and the state of the cells with a supply voltage of 1.2 to 1.9 V determined.

To summarize, the sensing circuitry provides a circuit structure that is fully compatible with standard processes and enables discriminating between small current differences, e.g. differences of about 1 $\mu A$.

What is claimed is:

1. Sensing circuitry for reading and verifying the contents of electrically programmable and erasable non-volatile memory cells, which circuitry comprises a sense amplifier having a first sensing circuit portion connected to a cell to be read and provided with an output terminal for connection to a first input terminal of a comparator, and having a second reference circuit portion connected to a reference current generator and provided with an output terminal for connection to a second input terminal of said comparator, characterized in that said first and said second circuit portions comprise a series of first and second transistors, respectively, being connected between a first voltage reference and a second voltage reference and having respective points of interconnection taken to said output terminals of said first and second circuit portions.

2. Sensing circuitry according to claim 1, characterized in that said second transistor in said second circuit portion comprises a parallel of third and fourth transistors, the control terminal of said fourth transistor being connected to said output terminal of said first circuit portion.

3. Sensing circuitry according to claim 1, characterized in that it comprises a bias and precharge block connected between a first voltage reference and a second voltage reference, as well as connected to control terminals of said first transistors in said first and second circuit portions and to the control terminal of said second transistor in said first circuit portion.

4. Sensing circuitry according to claim 1, characterized in that said first transistors in said first and second circuit portions are PMOS transistors, and said second transistors in said first and second circuit portions are NMOS transistors.

5. Sensing circuitry according to claim 1, characterized in that said second transistor in said first circuit portion comprises a pair of transistors, being connected in parallel with each other in a diode configuration and having control terminals connected to said output terminal of said first circuit portion.

6. Sensing circuitry according to claim 3, characterized in that said first transistors in said first and second circuit portions have interconnected control terminals.

7. Sensing circuitry according to claim 6, characterized in that said bias block has a first leg and a second leg, with said first leg comprising a cascade of a first transistor in a diode configuration and a second transistor, and said second leg comprising a cascade of a first transistor and a second transistor, the control terminal of said second transistor in said first leg being connected to a shared node of said first transistor and second transistor in said second leg.

8. Sensing circuitry according to claim 7, characterized in that said first transistor in said first leg forms a current mirror configuration with the first transistors in said first and second circuit portions.

9. Sensing circuitry according to claim 7, characterized in that said first transistor in said first leg and said first transistor in said second leg form a current mirror.

10. Sensing circuitry according to claim 7, characterized in that said second transistor in said second leg is a cascade of third and fourth transistors, said second leg further comprising a fifth transistor connected between a shared node of said third and fourth transistors and said second voltage reference, said fifth transistor having a control terminal connected to a control terminal of said second transistor in said first circuit portion.

11. Sensing circuitry according to claim 1, characterized in that said comparator includes a current mirror formed of first and second transistors, with said first transistor being a diode configuration.

12. Sensing circuitry according to claim 11, characterized in that said first transistor of said comparator is connected in series with a third transistor, and that said second transistor of said comparator is connected in series with a fourth transistor, said third transistor having a control terminal connected to the node, and said transistor having a control terminal connected to said node.

13. Sensing circuitry according to claim 12, characterized in that said third transistor and fourth transistor of said comparator, and said second transistor in said first circuit portion and said second transistor in said second circuit portion, are all the same size.

14. Sensing circuitry according to claim 3, characterized in that it comprises an auxiliary precharge circuit connected between said first and said second voltage reference, said auxiliary precharge circuit including a current mirror formed of first and second transistors, with said first transistor being a diode a configuration, said auxiliary precharge circuit further including a third transistor connected in series with said first transistor, the second transistor being connected to said first node.

15. Sensing circuitry according to claim 14, characterized in that said auxiliary precharge circuit also has a leg comprising a first transistor connected in cascade with a second transistor, the latter in a diode configuration, and comprising a third transistor connected in parallel with said transistor, a control terminal of said third transistor and a control terminal of said second transistor of said mirror in said auxiliary precharge circuit being connected together.

* * * * *